United States Patent [19]

Joyce

[11] 3,801,832

[45] Apr. 2, 1974

[54] SOLID-STATE RELAY

[75] Inventor: Michael F. Joyce, Chicago, Ill.

[73] Assignee: North American Philips Corporation, Skokie, Ill.

[22] Filed: Apr. 29, 1970

[21] Appl. No.: 32,794

Related U.S. Application Data

[60] Continuation-in-part of Ser. No. 829,273, June 2, 1969.

[52] U.S. Cl. .......... 307/252 B, 307/252 T, 307/311

[51] Int. Cl. .......... H03k 17/72

[58] Field of Search .......... 307/252, 249, 250, 254, 307/311, 304, 285; 331/111, 107

[56] References Cited

UNITED STATES PATENTS

| | | | |
|---|---|---|---|
| 3,487,292 | 12/1969 | Tibbetts | 307/252 T |
| 3,221,183 | 11/1965 | White | 307/252 T |
| 2,899,652 | 8/1959 | Read | 317/235 |
| 3,524,986 | 8/1970 | Harnden | 307/311 |
| 3,486,821 | 12/1969 | Westhauer | 307/311 |
| 3,381,144 | 4/1968 | Thomas | 307/254 |
| 3,474,293 | 10/1969 | Siuko | 307/252 T |
| 3,321,641 | 5/1967 | Howell | 307/252 |
| 3,457,430 | 7/1969 | Samuelson | 307/257 |
| 3,163,776 | 12/1964 | Teetor | 307/257 |
| 3,351,786 | 11/1967 | Muller | 307/308 |
| 3,266,021 | 8/1966 | Druz | 307/252 Q |
| 3,222,550 | 12/1965 | Willard | 307/285 |
| 3,350,576 | 10/1967 | Zimmerman | 307/285 |

FOREIGN PATENTS OR APPLICATIONS

| | | | |
|---|---|---|---|
| 363,055 | 8/1962 | Switzerland | 307/249 |

OTHER PUBLICATIONS

Amelco Semiconductor, No. 1, Field Effect Transistor, p. 1, June 1962.

*Primary Examiner*—John Zazworsky
*Attorney, Agent, or Firm*—Frank R. Trifari

[57] ABSTRACT

A solid-state relay comprising, in place of the coil of an ordinary relay, an electronic circuit including an energy-storage reactive element and a solid-state negative resistance component connected to the reactive element and having a negative resistance or a breakdown or break-over characteristic. In place of the metallic contacts of an ordinary relay, this invention includes solid-state means having a relatively high impedance condition and a condition of relatively low, or substantially zero, impedance. Coupling means, which may include inductive elements, light-emissive and light-sensitive elements, crystals, or other energy transmission elements, connect the "coil" part of the circuit to the "contact" part while providing electrical isolation between the two parts.

11 Claims, 11 Drawing Figures

INVENTOR.
MICHAEL F. JOYCE

ATTORNEY

INVENTOR.
MICHAEL F. JOYCE
Donald P. Gillette
ATTORNEY

INVENTOR.
MICHAEL F. JOYCE
Donald P. Gillette
ATTORNEY

SOLID-STATE RELAY

This application is a continuation-in-part of my co-pending application Ser. No. 829,273, filed June 2, 1969 now abandoned.

FIELD OF THE INVENTION

This invention relates to solid-state relays and particularly to relays capable of controlling relatively high current and capable of being actuated either by direct voltage having a wide range of magnitudes or by alternating voltage having a wide range of amplitude values and frequencies.

BACKGROUND OF THE INVENTION

Ordinary relays have a coil which, when energized from a controlling source of power, produces a magnetic field that actuates a magnetic armature which usually is electrically isolated from the coil. The armature in turn actuates mechanical contacts, either to open or to close them, and some or all of these contacts are isolated from the armature and the coil. In order to control the operation of the armature efficiently, it is customary to design the coil to operate at approximately a predetermined applied voltage value from a source capable of supplying the required operating current. Electromagnetic relays are characterized by a hysteresis effect, which causes the voltage that actuates the contacts of the relay to be different from, and usually greater than, the voltage at which the contacts are allowed to return to their original positions. In addition, relays are normally designed to be operated either by alternating current or direct current, but frequently not by both.

The present invention comprises a relay that utilizes solid-state components, which have long life and high reliability, to take the place of the section equivalent to the coil of an ordinary relay and the section equivalent to the contacts. In addition, the relay of the present invention has excellent sensitivity and is capable of operating at high speed. A particularly important feature is that the section that corresponds to the coil of a normal relay is capable of being energized either by alternating current or direct current and by a voltage having an unusually wide range, from a threshold of about 3 volts to about 140 volts in the case of alternating current up to about 80 KHz, and from the same threshold up to about 200 volts in the case of actuation from a direct current source. This solid-state relay also is characterized by returning the contact section to the unenergized condition as soon as the actuating voltage falls below the threshold value, which means that this relay is substantially free of hysteresis effect. This permits one relay design to cover a wide range of uses. Yet, contrary to many solid-state circuits that are more or less equivalent to relays, the relay of the present invention has its coil section isolated from its contact section. The contact section is capable of carrying a relatively high steady-state current in an environmental temperature that may go far above room temperature and is also capable of handling high surge currents, and the relay is protected against transients. Moreover, the solid-state relay of the present invention can be constructed so that it occupies a relatively small space and, since it has no heavy coil or iron core, has relatively low weight.

BRIEF DESCRIPTION OF THE DRAWINGS

The relay of the present invention will be described in further detail in the following specification together with the drawings in which.

DETAILED DESCRIPTION OF THE INVENTION

Figures 1, 2:
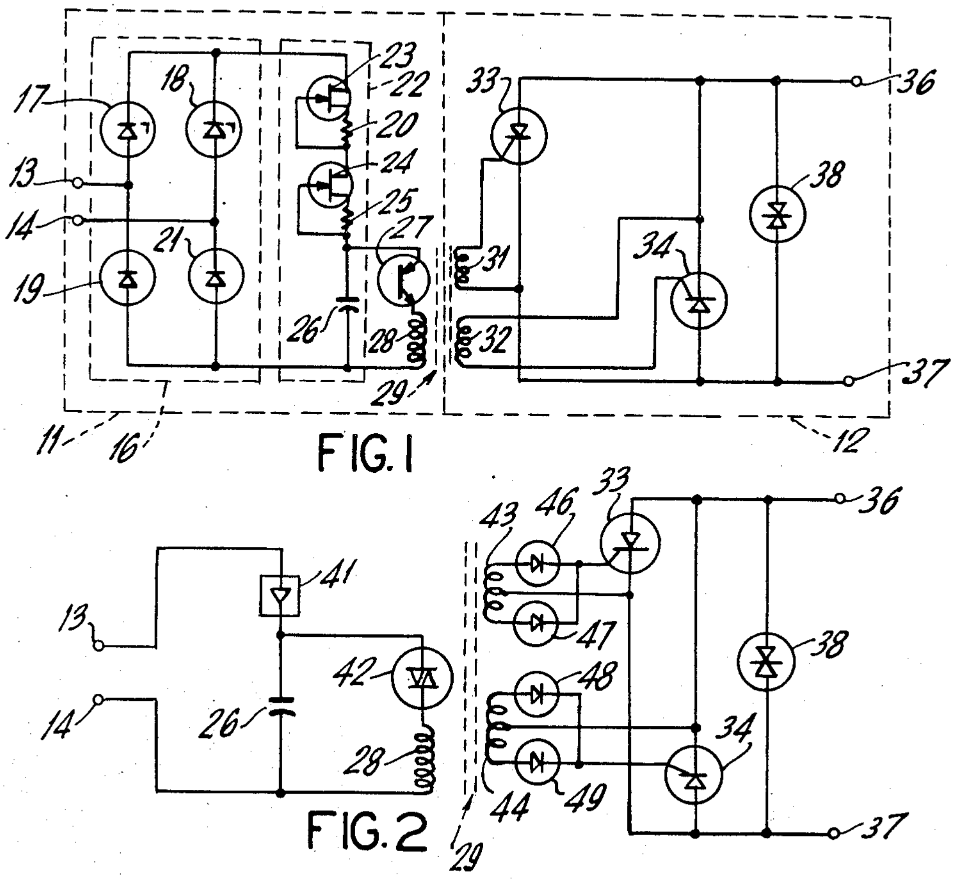
FIG. 1 is a schematic diagram of one embodiment of the solid-state relay of the present invention.
FIG. 2 is another embodiment of the relay of the present invention.

The circuit in FIG. 1 comprises a first section 11 that takes the place of the coil of a regular relay and a second section 12 that takes the place of single-pole-single-throw contacts of the relay. The first section has input terminals 13 and 14 to which an actuating voltage, either DC or AC, may be applied.

For DC operation the actuating voltage may be obtained from a source capable of supplying a voltage having a value between about 3 volts and 200 volts. For AC operation, the actuating voltage may have an amplitude between about 3 volts and 140 volts and any frequency up to about 80 KHz. These values of voltage and frequency are only illustrative of the wide range of operating parameters of working embodiments of the circuit in FIG. 1 and are not to be viewed as limitations of the invention. The terminals 13 and 14 are shown connected to a rectifier circuit 16, although for fixed frequency operation or for operation on DC, no rectifier circuit is required. The rectifier circuit in the present embodiment is a full-wave bridge rectifier comprising two zener diode voltage surge-limiters 17 and 18 and two regular diodes 19 and 21 to change AC actuating signals applied to the terminals 13 and 14 to a rectified voltage.

One of the main advantages of the present invention is that the relay is actuated as soon as the voltage applied to the input terminals exceeds a threshold value, which, for circuits actually built, has been found to be about 3 volts. Moreover, the relay ceases to be actuated as soon as the applied voltage drops below the threshold value.

The rectified output voltage across the diodes 18 and 21 (or 17 and 19) is connected to the ends of a series relaxation circuit comprising an impedance 22, which in the present instance is made up of two field-effect transistors 23 and 24, or FETs, as they are usually called, and a capacitor 26. Each FET has a substantially constant-current characteristic over a relatively wide range of voltage, and by using two similar FETs in series, the total range is nearly doubled. The current through the FETs is controlled by the values of two resistors 20 and 25 connected in series with the FETs 23 and 24. The FETs may be operated either in the enhancement mode or the depletion mode. If the former, increasing the resistance of the resistors 20 and 25 reduces current through the FETs; if the latter, increasing the resistance of the resistors 20 and 25 increases the current. FETs may also be used with the resistors 20 and 25 included as part of the inherent resistance of the devices.

In parallel with the capacitor 26 is a negative resistance element, or NRE, 27 in the form of a unilateral four-layer diode, although other negative resistance elements, such as avalance transistors, double base diodes, tunnel diodes, and the like may be used instead. The negative resistance element can also be a light-emitting device having a breakover characteristic that exhibits a sharp reversal of slope at a certain voltage value. The capacitor 26 can also be of the type that emits light at a certain voltage.

The final element in section 11 is the primary winding 28 of a pulse transformer 29. The pulse transformer is not required to transmit much power, and therefore it may be rather small in comparison, for example, to the coil of a normal relay capable of controlling as high a value of current as the relay of the present invention. This is not to say that the transformer 29 in any way performs the same function as the coil of a normal relay; it is merely to give a rough indication of physical size.

In the embodiment in FIG. 1 the primary winding 28 of the transformer 29 is coupled to two secondary windings 31 and 32. This is the coupling between the coil section 11 and the contact section 12 of the relay. Winding 31 is connected in series between the cathode electrode and gate of a silicon-controlled rectifier, or SCR, 33, and winding 32 is similarly connected between the cathode and gate electrode of another SCR 34. The anode-cathode circuits of the two SCRs are connected directly in parallel, but in inverse polarity, between two terminals 36 and 37 that are equivalent to the contact terminals of a normal relay. A bilateral zener diode 38 is shown connected in series between the terminals 36 and 37 and in parallel with the SCRs 33 and 34 as a protection against the application of excessively high voltage across the SCRs.

In operation, an actuating voltage applied to the terminals 13 and 14 is rectified by the rectifier 16, if it is an alternating voltage, so that the junction between the diodes 17 and 18 and the FET 23 is positive with respect to the junction between the diodes 19 and 21 and the capacitor 26. If the actuating voltage is a direct voltage, it must be applied so as to make the junction between the diodes 17 and 18 positive with respect to the junction between the diodes 19 and 21 and the capacitor 26. The magnitude of a direct voltage would be expected to remain constant, but the instantaneous magnitude of a rectified alternating voltage would vary from instant to instant. However, in either case the FETs 23 and 24 permit only a substantially constant current to flow through to the capacitor 26, which causes voltage to build up across the capacitor at a uniform rate. When the voltage across the negative resistance element 27 reaches a certain value, the impedance suddenly becomes substantially less and discharges the voltage across the capacitor 26. This discharge is in the form of a pulse of current through the primary winding 28 which is magnetically coupled to the secondary windings 31 and 32. The parameters of operation, which include the current through the FETs 23 and 24, the capacitance of the capacitor 26 and the breakover, or breakdown, voltage of the negative resistance element 27 are selected so that the repetition rate of current pulses through the primary 28 is about 2,200 per second. The repetition rate determines how long, after an actuating voltage is applied to the terminals 13 and 14 the SCRs 33 and 34 are in condition to conduct current between the terminals 36 and 37.

All pulses applied to the primary winding 28 produce output voltage pulses across the secondary windings 31 and 32 and these windings are so polarized as to apply the pulses between the gate and cathode electrode of the SCRs 33 and 34 in the proper polarity to cause the SCRs to conduct, provided a sufficient voltage is applied across the terminals 36 and 37, since the SCRs operate only when the voltage of the proper polarity is applied to their gate electrodes to make one or the other of the SCR 33 or the SCR 34 conductive, depending on the polarity of the voltage applied to the terminals 36 and 37. The repetition rate of 2,200 pulses per second was chosen to assure that at least one of the pulses will occur to turn on either the SCR 33 or the SCR 34 within the first 10° of each half cycle of the 60 Hz. For AC applied across the terminals 36 and 37 for operation at 400 Hz or other frequencies, different circuit parameters should be selected to obtain a pulse within about the first 10° or less. Once either of the SCRs is turned on it will remain on for the rest of the half cycle of voltage applied to the terminals 36 and 37 until reversal of voltage of the terminals 36 and 37 allows whichever SCR was conductive to return to the non-conductive state, and so the speed or efficiency of operation is largely determined by how quickly the SCRs conduct after the beginning of a half cycle.

The double anode zener diode 38 used as a protective device across the SCRs 33 and 34 has the operating characteristic of breaking down if the voltage across it exceeds a certain value, but instead of dropping to zero impedance the diode 38 simply maintains the voltage at the breakdown level. Thus, if the normal voltage to be controlled by the contacts has a normal peak of 167 volts, and the SCRs 33 and 34 can withstand 250 volts, the diode 38 may be chosen to have a breakdown voltage of about 200 volts, which is greater than the normal peak voltage but less than a destructive voltage.

In FIG. 2, the coil input terminals 13 and 14 are connected without any rectifier to the ends of a series circuit comprising a constant current device 41 and the capacitor 26. In parallel with the capacitor 26 is a bilateral breakover diode 42 and the primary winding 28 of the pulse transformer 29. The bilateral breakover diode 42 is capable of being actuated by direct current or by either half of the alternating current applied to the input terminals 13 and 14, and the resultant pulses applied to the transformer 29. In the case of actuation by unrectified AC, the series of pulses consists of a series of positive-going pulses followed by a series of negative-going pulses. Because the current pulses applied to the input winding 28 are of one polarity during part of the input cycle of alternating current applied to the terminals 13 and 14 and are of the opposite polarity during the other half of the cycle of the actuating signal applied to the terminals 13 and 14, half of the pulses coupled through to the secondary winding of the transformer 29 must be inverted. This is accomplished by providing two center-tapped secondary windings 43 and 44 for the transformer 29. The center tap of the winding 43 is connected to the cathode of the SCR 33 while the center tap of the winding 44 is connected to the cathode of the SCR 34. The ends of the winding 43 are connected to a full wave rectifier diode circuit comprising diodes 46 and 47 which are connected to the gate electrode of the SCR 33. A similar rectifier circuit comprising two diodes 48 and 49 connects the ends of the winding 44 to the gate electrode of the SCR 34.

The pulses induced in the secondary windings 43 and 44 cause the diodes 46 and 48 to operate for one series of pulses of one polarity and the diodes 47 and 49 to operate for the series of pulses of the opposite polarity. As a result, the pulses applied to the gate electrodes of the SCRs 33 and 34 are of the proper polarity to bias the SCRs so that they can be conductive as soon as a voltage of the proper polarity is applied to the contact terminals 36 and 37. As in the case of the circuit in FIG. 1, the SCR conducts during one half of each cycle of the alternating current applied to the contact terminals 36 and 37 and the SCR 34 conducts during the alternate half of each cycle.

The relays shown in FIGS. 1 and 2 both have only a single pair of contact terminals 36 and 37 and they are thus equivalent to single-pole-single-throw normally-open relays. The coil portion 11 of the circuit in FIG. 1 may also be used to control more than one set of "contacts." FIG. 3 shows the contact portion of the circuit for double-pole-single-throw normally-open operation.

Figure 3:
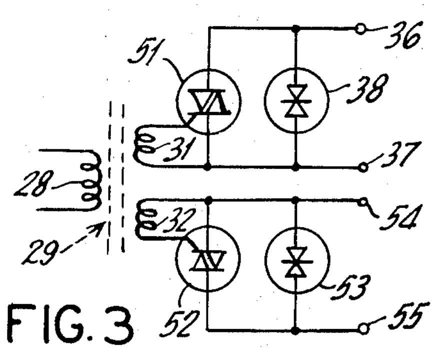
FIG. 3 shows a modification of the contact portion of the relay of FIG. 1 for operation as a double-pole-single-throw relay.

In FIG. 3 the secondary winding 31 of the transformer 29 is connected to the gate electrode of a triac 51. Triacs are capable of becoming conductive for either half of an AC cycle. In effect, the triac 51 takes the place of two SCRs 33 and 34 in FIG. 1 but operates more slowly than the SCRs and is therefore used primarily for controlling alternating current having a frequency only up to about 400 Hz. Triacs must be commutated, like SCRs, which is to say that they remain conductive, once they are energized, until their anode-cathode voltage reverses polarity. Therefore the circuit of FIG. 3 cannot operate on direct current.

The winding 32 is connected to another triac 52, and separate double anode zener diodes 38 and 53 are connected across the triacs 51 and 52 for transient protection. As required for double-pole operation, contact terminals of the two sections are separate from each other. One pair of contact terminals 36 and 37 is connected across the triacs 51 while a second pair of contact terminals 54 and 55 is connected across the other triac 52.

Figure 4:
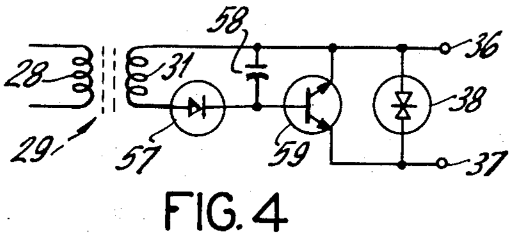
FIG. 4 shows another modification of the contact portion of the relay of FIG. 1 for operation in controlling either direct or alternating currents.

FIG. 4 shows a contact section of a relay capable of operating on both AC and DC. The coil portion may be the same as is shown in FIG. 1 or FIG. 2. The pulse transformer 29 in FIG. 4 requires only a single secondary winding 31 which is connected to a rectifier circuit comprising a diode 57 and a capacitor 58 across which a pulsating DC is produced from the pulses coupled through the transformer 29. The DC component of the voltage across the capacitor 58 is connected to the base of a bilateral transistor 59, the output electrodes of which are connected to the terminals 36 and 37. The bilateral zener diode 38 is connected in parallel with the output electrodes of the transistor 59 as a protection against the application of excessive voltage to the terminals 36 and 37. As in all of the circuits where this bilateral zener protective diode is used, it is required to become conductive upon the application of excess voltage and prior to any destructive breakdown of the solid-state device being protected, in this case the bilateral transistor 59.

In operation, as long as pulses are supplied to the primary 28 of the pulse transformer 29, the rectified voltage applied to the base of the bilateral transistor 59 remains in a conductive state, no matter what the polarity of the voltage applied to the terminals 36 and 37 may be, but ceases to conduct as soon as the pulses cease to be applied, and therefore it is not necessary to commutate the transistor 59. In this respect the bilateral transistor 59 differs from the SCRs and triacs shown in FIGS. 1 and 3.

Figure 5:
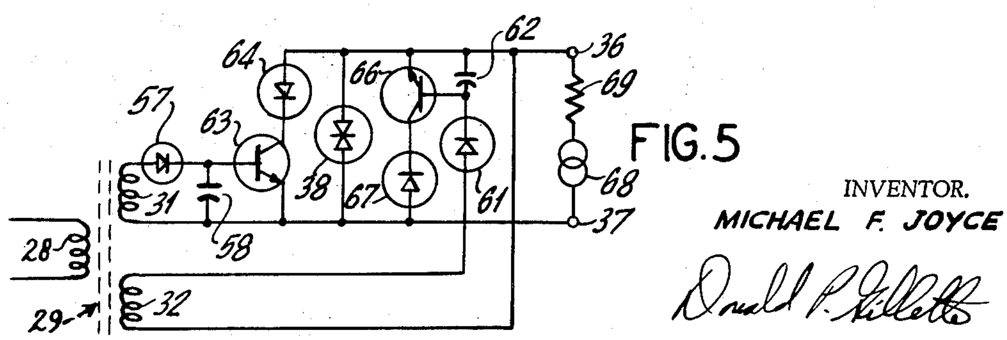
FIG. 5 is another modification of the contact portion of the relay of FIG. 1 for controlling either direct or alternating currents.

FIG. 5 shows another modification of the contact portion of the relay in FIG. 1. In FIG. 5 the transformer 29 has its primary winding 28 connected to a circuit of the type shown in FIGS. 1 or 2 and it has a first secondary winding 31 connected to a first rectifier circuit including the diode 57 and capacitor 58. The other secondary winding 32 of the pulse transformer 29 is connected to a second rectifier circuit comprising a diode 61 and a capacitor 62. The first rectifier circuit is connected to the base of a bipolar transistor 63 which is connected in series with a protective diode 64 across the terminals 36 and 37. The other rectifier circuit is connected to the base of a second bipolar transistor 66 which is connected in series with a second protective diode 67 across the terminals 36 and 37. A single bilateral zener diode 38 serves as an excess voltage protection device for both of the bipolar transistors. Voltage required to operate the transistors 63 and 66 is obtained from a generator 68 which is connected in series with the lead 69 across the terminals 36 and 37.

The transistors 63 and 66 conduct for only one polarity of voltage applied to their emitter and collector electrodes and therefore to obtain conduction through both halves of each cycle of AC produced by the generator 68, two transistors 63 and 66 are required. In addition to the necessity of providing voltage of proper polarity to allow current to flow through the emitter-collector circuits of the transistor 63 and 66, a proper bias level must be applied to their base electrodes. This bias level is obtained by rectification of the pulses coupled through the transformer 29 to the diodes 57 and 61.

Figure 6:
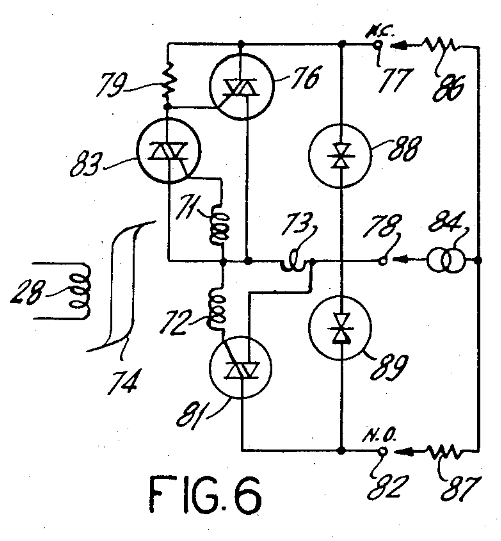
FIG. 6 is a further modification of the contact portion of the circuit in FIG. 1 to provide single-pole-double-throw operation.

FIG. 6 shows the contact portion of a single-pole-double-throw relay so arranged as to assure that the circuit that connects the common contact terminal and one of the other contact terminals always becomes non-conductive before the circuit that connects the common contact terminal to a third contact terminal becomes conductive. The circuit in FIG. 6 comprises a pulse transformer having an input winding 28 and three secondary windings 71, 72 and 73, all wound on a core 74 having a square hysteresis characteristic as indicated schematically in the drawing. It is not necessary that the hysteresis loop be as square for the purpose of this invention as is sometimes required for other circuits. The word "square" will be used hereinafter in that broad sense.

The first triac 76 has one of its output electrodes connected to a terminal 77 which is identified as the normally-closed, or NC, terminal. The other output electrode is connected to the junction of the three windings 71–73. The windings 73 normally will not have as many turns as the windings 71 and 72 and is connected from the common junction of the three windings to a common contact terminal 78. The control el of the triac 76 is connected by way of a resistor 79 to the normally-closed terminal 77.

The second triac 81 has its output electrodes connected directly between the common terminal 78 and a third terminal 82 which may be referred to as the normally-open, or NO, terminal. The gate electrode of the triac 82 is connected to the free end of one of the secondary windings 72.

A third triac 83, which may have a lower current-carrying capacity than the two main triacs 76 and 81, has its output electrodes connected between the gate electrode of the triac 76 and the common junction of the secondary windings 71–73. The gate electrode of the triac 83 is connected to the free end of the secondary winding 71.

As is customary in the case of a single-pole-double-throw relay, the embodiment shown in FIG. 6 operates with a single ower source 84, which must be of the alternating type to commutate the triacs 76 and 81, connected to the common terminal 78 and connected by branch circuits to two load impedances 86 and 87, the first of which is connected to the normally-closed terminal 77 and the second of which is connected to the normally-open terminal 82. A pair of bilateral protective zener diodes 88 and 89 is connected between the terminals 77 and 78 and the terminals 78 and 82, respectively, to guard the triacs 76 and 81 against excessive voltages from the source 84.

When the circuit in FIG. 6 is first energized, and assuming there are no pulses applied to the primary winding 28, current will flow from the source 84 through the load 86, the terminal 77, the triac 76, secondary winding 73, and the common terminal 78. In order for this current flow to take place, the triac must be conductive and it is for this reason that its gate electrode is connected via the resistor 79 to the terminal 77. The triac 76 under such conditions, and providing that the impedance of the resistor 79 is of the right value, will conduct during both the positive and negative half cycles of alternating current from the source 84. The resistance of the resistor 79 is selected for optimum operating conditions and may be in the range of approximately 200 ohms to about 20K. The triac 76 does not conduct at the initial instant of each half cycle; there is a delay in its conduction of a few degrees, typically about 10 degrees, of each half cycle of AC from the source 84 to assure that the triac 76 conducts before the triac 81 in the absence of any pulses applied to the primary winding 28.

When it is desired to energize the contacts of the embodiment in FIG. 6 so as to open the normally-closed circuit and close the normally-open circuit, pulses are generated in a coil section, such as section 11 in FIG. 1, and applied to the primary winding 28. These pulses are coupled to the secondary winding 71 to bias the triac 83 to the conductive state, which creates a low impedance circuit between the gate electrode of the triac 76 and the common terminal and prevents the triac 76 from becoming conductive at the beginning of the next half cycle of AC from the source 84 after the pulses start to be applied to the primary 28. This prevention of conductivity of the triac 76 must take place during the initial part of a half cycle of AC from the source 84 before the triac 76 has already become conductive.

At the same time, pulses are coupled to the secondary winding 72 to render the triac 81 conductive, thereby creating a low impedance, or almost a short circuit, between the common terminal 78 and the normally-open terminal 82 and allowing current to flow from the source 84 through the load 87, the terminal 82, the triac 81 and the terminal 78.

The purpose of the winding 73 is to sense current flowing through the triac 76 and thus bias the square loop core 74 to a point on its loop that prevents pulses from being coupled through from the secondary wingings 71 and 72 until all current has stopped flowing through the triac 76. This prevents the normally-open terminal 82 from being connected to the common terminal 78 before the normally-closed terminal 77 has become disconnected and is referred to in relay terminology as break-before-make operation.

It is unnecessary to sense current flowing through the triac 81 because it will not be conductive except when pulses are being applied to the primary 28. Because the current that flows through the triac 76 also flows through the coil 73, the latter should have as low an impedance as possible.

Figure 7:
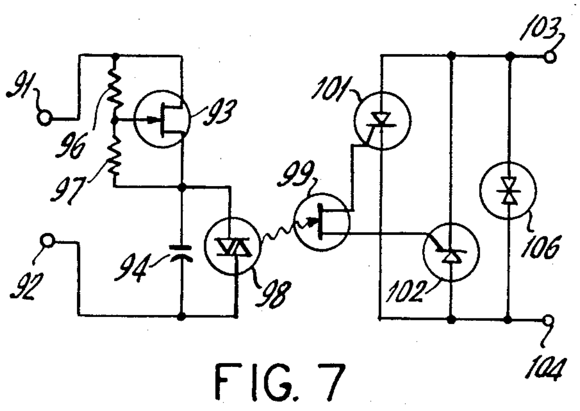
FIG. 7 is another embodiment of a relay according to the invention utilizing light-emissive and light-responsive coupling means.

FIG. 7 shows a different embodiment of a relay using light as the medium of transmitting pulses from the coil portion to the contact portion of the circuit. The coil portion of the circuit in FIG. 7 comprises input terminals 91 and 92 and a series circuit comprising a FET 93 and a capacitor 94. Two bias-setting resistors 96 and 97 are connected to the FET and a photo-emissive solid state device 98 having a breakdown characteristic is connected in parallel with the capacitor 94.

The contact portion of the circuit in FIG. 7 comprises a photo-sensitive FET 99 connected to the gate electrodes of two SCRs 101 and 102. The SCRs are connected in inverse polarity and in parallel between a pair of terminals 103 and 104 which are the contact terminals of the solid state relay. A double anode zener diode 106 is connected as a protective device in parallel with the SCRs 101 and 102.

In operation, when an actuating voltage is applied to the input terminals 91 and 92, current through the FET 93 causes voltage to build up across the capacitor 94 until the photo-emissive device 98 reaches its breakdown potential and emits a light impulse. The photo FET 99 must, of course, be within line of sight of the light-emissive device 98 and both of these components must be shielded from external light. When the photo FET 99 receives an impulse of light, it biases the SCRs 101 and 102 so that one or the other will be conductive, depending on the relative polarities of the terminals 103 and 104. When the actuating voltage is removed from the terminals 91 and 92, current through the FET 93 stops and the repetitive build-up of voltage across the capacitor 94 also stops and there is no further emission of pulses of light by the solid-state device 98.

Figure 8:
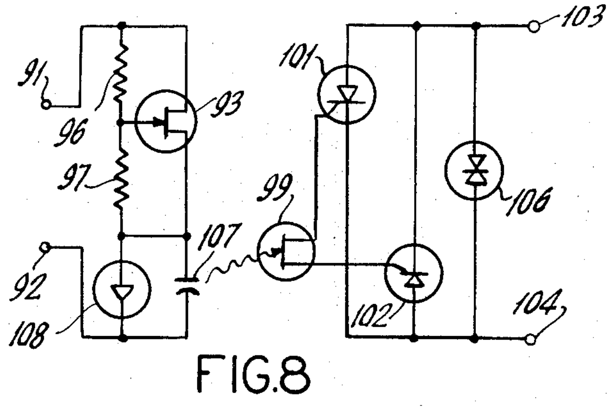
FIG. 8 is a further embodiment of the relay according to the invention utilizing a light-emissive capacitor as part of the coupling means.

The circuit in FIG. 8 is similar to that in FIG. 7, except that instead of the photo-emissive solid-state device of FIG. 7, FIG. 8 has a photo-emissive capacitor 107 connected in series with the FET 93 and in parallel with a solid-state element 108 having a breakdown characteristic. The contact portion of FIG. 8 is identical with that in FIG. 7.

In operation, voltage builds up across the capacitor 107 when an actuating voltage is applied to the terminals 91 and 92. At a predetermined value, the voltage across the capacitor 107 causes it to emit light. The element 108 breaks down shortly thereafter and short-circuits the capacitor 107, discharging it to a voltage lower than required for it to emit light. Thus, the capacitor 107 emits pulses of light at a repetition rate determined by the current passing through the FET 93 and the capacitance of the capacitor 107.

Figure 9:
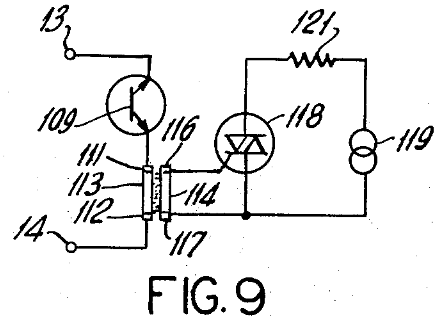
FIG. 9 is an embodiment of the invention utilizing piezo-electric coupling means.

FIG. 9 shows a modified coupling arrangement for the relay of the present invention. In this embodiment, the input terminals 13 and 14 are connected to the ends of a series circuit comprising a solid-state device 109 having a voltage breakover characteristic and two electrodes 111 and 112 on opposite sides of piezo-electric crystal 113. The crystal 113 is physically joined to a second crystal 114 to actuate the latter by transmitting movement from the crystal 113 to the crystal 114. For example, the crystal, which may be in the form of small wafers, may be glued together in surface-to-surface contact. The crystal 114 has a pair of electrodes 116 and 117 connected respectively to the gate electrode and an anode of a triac 118. The two output electrodes of the triac are connected in series with a power supply 119 and a load impedance 121.

In operation, the application to the terminals 13 and 14 of the voltage exceeding the threshold voltage causes the solid-state device 109 to reach its breakover point and to apply a sudden voltage impulse across the electrodes 111 and 112. This impulse abruptly deforms the crystal 113 due to the piezo-electric effect, and is mechanically transmitted to the second crystal 114 as a sudden deformation. The piezo-electric effect in the second crystal produces a voltage pulse across the terminals 116 and 117 to turn on the triac 118. As stated in connection with FIG. 6, once the triac 118 has become conductive, it will remain conductive until the voltage across the output terminals of the triac reaches zero at the end of any half cycle of its alternating period.

Figure 10:
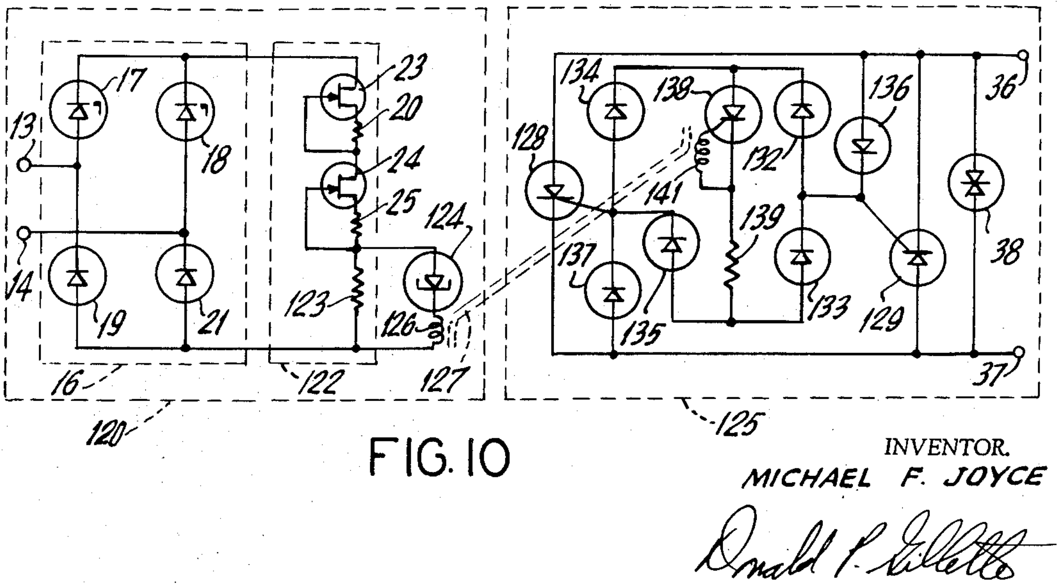
FIG. 10 shows a still different embodiment of the invention.

FIG. 10 shows a circuit that is related to the circuit in FIG. 1 in that it is divided into a control section, which is identified by reference numeral 120 and a contact section, which is identified by reference numeral 125. The control section 120 could be used in place of the corresponding control section 11 of FIG. 1, and it comprises a number of components similar to those in FIG. 1 and indicated by similar reference numerals. These components include a pair of input terminals 13 and 14 connected to a full-wave bridge rectifier 16 comprising diodes 17, 18, 19 and 21. The output of the bridge rectifier is connected to a series circuit 122 comprising two FETs 23 and 24 connected in series with biasing resistors 20 and 25, respectively, and with a resistor 123. A series circuit comprising a tunnel diode 124 and the primary 126 of a transformer 127 is also connected in series with the FETs 23 and 24 and across the resistor 123.

The contact portion of the circuit in FIG. 10 comprises two SCRs 128 and 129 connected in opposite polarity between the output terminals 36 and 37. The control circuits for the SCRs comprise a bridge circuit 131 made up of four diodes 132, 133, 134, and 135. In addition there is a diode 136 connected from the terminal 36 to the gate electrode of the SCR 129 and a similar diode 137 connected between the terminal 37 and the gate electrode of the SCR 128. A control SCR 138 connected in series with a resistor 139 forms a series circuit between the junction of the cathode electrodes of the diodes 132 and 124 and the anode electrodes of the diodes 133 and 135. A secondary winding 141 of the transformer 127 is connected in series between the gate and cathode electrodes of the SCR 138.

The operation of the circuit in FIG. 10 begins with the application of an actuating voltage to the input terminals 13 and 14 to cause a current to flow through the FETs 23 and 24. The nature of the FETs is such that this current produces a substantially constant voltage across the resistor 123. The inductance of the transformer primary 126 acts as an energy-storage reactive element and, in series with the negative voltage characteristic of the tunnel diode 124, corms an oscillation circuit of relative high frequency, for example around 80 KHz. The oscillations produced are more or less sinusoidal and are connected by the transformer 127 to the secondary 141. In order to improve the energy storage capability of the transformer 127, the turns ratio is normally quite different from that of the transformer 29 in FIG. 1. For example, the primary 28 of the transformer 29 in FIG. 1 may have six turns and each of the secondary windings 31 and 32 10 turns. The primary winding 126 of the transformer 127 in FIG. 10, on the other hand, may typically have nine turns and the secondary 70 turns.

The oscillations produced by the tunnel diode 124 and the primary winding 126, when coupled to the secondary winding 141, bias the gate electrode of the SCR 138 so that it can be conductive half of each cycle. When the SCR 138 is so biased and when the terminal 36 is made positive by the application of an alternating current to it, current is able to flow through the diode 136, the diode 132, the series circuit comprising the SCR 138 and the resistor 139, and the diode 135 to the gate electrode of the SCR 128 to render that SCR conductive for the remainder of the positive half cycle of the voltage applied to the terminal 36. Because of the high frequency of the oscillations produced by the tunnel diode 124 and the primary windings 126 the alternating current applied to the terminals 36 and 37 can have a relatively high frequency and still permit the SCR 128 to be conductive within the first 10° or so of each positive half cycle.

When alternating current applied to the terminals 36 and 37 reverses polarity, current can no longer flow through the path comprising the diodes 132, 135, and 136 and the SCR 138 to the gate of the SCR 128 to place the latter in a conductive state. Instead, current flows through an alternate path comprising the diodes 135, 134, and 133 and the SCR 138 to the gate of the SCR 129 as long as oscillations continue to be produced by the tunnel diode 124 and the primary winding 126 in the primary section 120. Thus the SCR 129 carries current during alternate half cycles when the SCR 128 is not able to do so.

If the actuating signal applied to the terminals 13 and 14 stops during any half cycle of the alternating current applied to the terminals 36 and 37, the contact section 125 of the relay becomes non-conductive at the end of that half cycle because current can no longer flow through the SCR 138 to energize either the SCR 128 or the SCR 129. It should be noted that, by virtue of the bridge circuit comprising the diodes 132–135, the SCR 138 always receives current from the terminals 36 and 37 with the proper polarity to flow through the SCR 138 as soon as oscillations are received at the gate electrode of the latter via the transformer 127.

Figure 11:
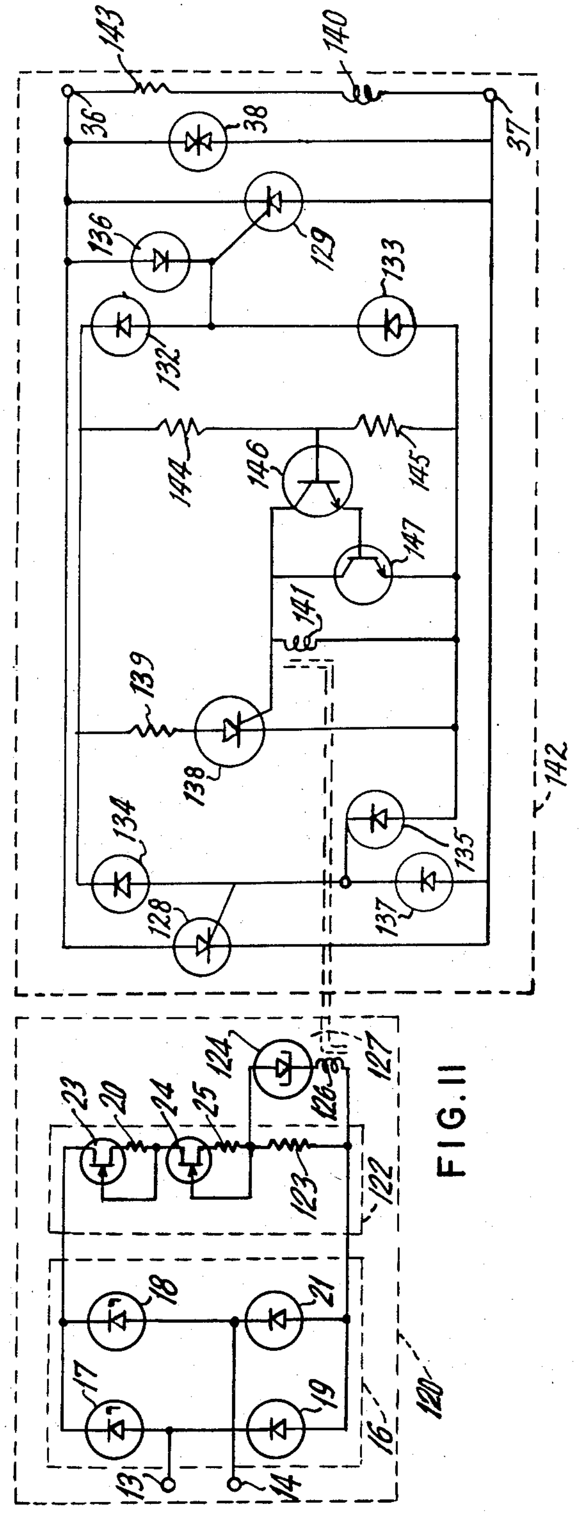
FIG. 11 shows a modified contact portion for synchronous operation in, for example, the embodiment of FIG. 10.

The terminals 36 and 37 are connected together by the low impedance of either the SCR 128 or the SCR 129 as soon as an actuating signal is applied to the terminals 13 and 14, unless it happens that the actuating signal is applied during the polarity reversal at the end of each half cycle of the alternating current applied to the terminals 36 and 37. This means that it is possible for the contact terminals 36 and 37 to be effectively short-circuited at the peak of the AC cycle, and in some cases that type of operation can be detrimental to equipment to which the relay is connected. In order to prevent this from happening the relay of the invention may be made to operate synchronously so that the contact portion of the circuit will become conductive only when the alternating voltage applied to the terminals 36 and 37 is at or close to zero. FIG. 11 shows a circuit by which such synchronous operation can be accomplished.

FIG. 11 is a solid state relay for controlling AC. In FIG. 11 the coil portion 120 of the circuit is identical with that in FIG. 10 and many of the components in a contact portion of the circuit, identified by reference numeral 142, are also similar to components in the contact portion of the circuit of FIG. 10. Such similar components are identified by similar reference numerals in both figures. In FIG. 11 the SCR 138 and the resistor 139 are connected in series across the bridge comprising the diodes 132–135 and the secondary winding 141 of the transformer 127 is connected between the gate electrode and the cathode of the SCR. AC from a source 140 is supplied through a load 143 and a full-wave rectifier comprising the diodes 132–135 to a voltage divider comprising two resistors 144 and 145. The base of a transistor 146 is connected to the common junction of the resistors 144 and 145, and the emitter of the transistor is connected to the base of a second transistor 147. The collectors of both the transistors 146 and 147 are connected directly to the junction of the coil 141 and the gate electrode of the SCR 138. The emitter of the transistor 147 is connected to the common junction of the diodes 133 and 135 and the coil 141 and the cathode of the SCR 138. This is a Darlington connection for the transistors 146 and 147.

The operation of the circuit in FIG. 11 is similar to that in FIG. 10. When an actuating voltage is applied to the terminals, the contact section 120 begins to produce oscillations, which are carried by the transformer 127 from its primary 126 to its secondary 141. However, the ability of these pulses to control the operation of the SCR 138 is limited by the Darlington-connected transistors 146 and 147. The full-wave rectified AC supplied to the base of the transistor 146 from the bridge circuit comprising the diodes 132–135 is of sufficient magnitude to cause both of the transistors 146 and 147 to highly conductive. The transistor 147, when conductive, virtually shortcircuits the secondary 141 and prevents any pulses generated in the coil section 120 from reaching the gate of the SCR 138. Only for a brief interval when the magnitude of the rectified voltage applied to the base of the transistor 146 is almost zero will the transistor 146, and therefore the transistor 147, be non-conductive. This occurs for a short interval of time immediately before and immediately after the end of each half cycle of AC from the source 140. During each such brief interval, the secondary 141 is not short-circuited, and pulses can be transmitted through it from the coil section 120 to the gate-cathode circuit of the SCR 138 to make the latter conductive. Once this occurs the SCR will remain conductive until commutated, or turned off, by reversal of polarity of the AC at the end of the half cycle. The SCR 138 controls the initiation of conductivity in one or the other of the SCR's 128 and 129, and therefore these SCR's are made synchronous with respect to the AC through the load 143. This is mandatory for circuits that must be switched only when the applied voltage is at or near zero.

What is claimed is:

1. A solid-state relay comprising:

A. A primary circuit comprising:
  1. input terminals, and
  2. a repetitive pulse generator connected to said terminals to be operated by actuating signals applied thereto;

B. A pulse transformer comprising:
  1. a primary winding connected to said pulse generator to receive pulses therefrom, and
  2. first, second, and third secondary windings all having one end connected together and all having a free end, C. A single-pole-double-throw contact circuit comprosing:
  1. a common contact terminal,
  2. second and third terminals, said contact terminals adapted to being connected to an A.C. load,
  3. a first bistable solid-state device having
     a. two output electrodes, and
     b. a gate electrode,
  4. a series circuit connected between said common contact terminal and said second contact terminal, and comprising:
     a. said output electrodes, and
     b. said first secondary winding,
  5. a gate-biasing impedance connected between said gate electrode and one of said output electrodes for biasing said solid-state device normally conductive at a predetermined interval after the beginning of each AC cycle of said AC load so as to provide a low-impedance path between said common contact terminal and said second contact terminal,
  6. a second bistable solid-state device comprising:

a. two output electrodes one of said electrodes being connected to said third contact, the other being connected to said common contact, and b. a gate electrode connected to said free end of said second secondary winding to bias said second solid-state device to be conductive to form a low-impedance path between said common contact terminal and said third contact terminal when pulses are generated by said generator and no current is flowing through said first secondary winding, 7. and a third bistable solid-state device comprising:

a. a first output electrode connected to the gate electrode of said first solid-state device
b. a second output electrode connected to said one end of said third secondary winding, and
c. a gate electrode connected to the free end of said third secondary winding to bias said third solid-state device to the conductive state when pulses are generated by said generator to bias said first solid-state device to a non-conductive state when pulses are generated by said generator.

2. The relay of claim 19 in which said pulse transformer comprises a core having a substantially rectangular hysteresis loop.

3. The relay of claim 2 in which said second and third secondary windings each have a substantially larger number of turns than said first secondary winding.

4. The relay of claim 1 in which said one end of said first secondary winging is connected to one of said output electrodes of said first solid-state device and said free end of said first secondary winding is connected to said common contact terminal.

5. The relay of claim 1 in which each of said solid-state devices is a triac.

6. The relay of claim 5 in which said gate-biasing impedance is a resistor having a value between about 200 ohms and 20,000 ohms.

7. The relay of claim 1 comprising, in addition:
A. A first double-anode zener diode connected between said common contact terminal and said second contact terminal; and
B. A second double anode zener diode connected between said common contact terminal and said third contact terminal.

8. A solid-state relay comprising:
A. A primary circuit comprising:
1. input terminals to receive an actuating signal, and
2. a pulse generating circuit connected to said input terminals to be energized by said actuating signal to supply pulses of energy;
B. A contact circuit comprising:
1. a pair of contact terminals to be connected to a load device and a source of electrical power,
2. a first SCR having:
a. an anode connected to one of said contact terminals, and
b. a cathode connected to the other of said contact terminals,
3. a second SCR having:
a. a cathode connected to said first-named contact terminal, and
b. an anode connected to said second-named contact terminal;
4. a first diode having:
a. an anode connected to said second-named contact terminal, and
b. a cathode connected to a gate electrode of said first SCR;
5. a second diode having:
a. an anode connected to said first-named contact terminal, and
b. a cathode connected to a gate electrode of said second SCR;
6. a bridge circuit comprising third, fourth, fifth, and sixth diodes connected in a closed loop, the junction between said sixth and third diodes being connected to the gate electrode of said first SCR, the junction between said fourth and fifth diodes being connected to the gate electrode of said second SCR;
7. a third SCR having:
a. an anode connected to the junction between said third and fourth diodes,
b. a cathode connected to the junction between said fifth and sixth diodes, and
c. a gate electrode; and
C. Means coupling said primary circuit to said contact circuit to receive pulses from said primary circuit and transmit them to said contact circuit to control the operation of said contact circuit by said primary circuit, said means coupling said primary circuit to said contact circuit comprising:
1. a transformer comprising:
a. a primary winding in said primary circuit, and
b. a secondary winding connected between said gate and cathode electrodes of said third SCR, said third and fifth diodes being polarized to conduct current through said third SCR when said second-named contact terminal is positive, and said fourth and sixth diodes being polarized to conduct current through said third SCR when said first-named contact terminal is positive.

9. The relay of claim 8 comprising, in addition:
A. Transistor means comprising:
1. an output circuit connected in parallel with said secondary winding, and
2. an input circuit; and
B. Circuit means connecting said input circuit to said contact terminals to receive full-wave rectified alternating voltage therefrom to energize said transistor means and cause said output circuit to be conductive to short-circuit said secondary winding except when the magnitude of said alternating voltage is close to zero.

10. The relay of claim 9 in which said transistor circuit means comprises a voltage divider connected in parallel with said third SCR between the anode and cathode thereof.

11. The relay of claim 10 in which said transistor circuit means comprises a pair of Darlington-connected transistors.

* * * * *

050
69)

UNITED STATES PATENT OFFICE
CERTIFICATE OF CORRECTION

:ent No. 3801832 Dated April 2, 1974 ventor(s) Michael F. Joyce

It is certified that error appears in the above-identified patent d that said Letters Patent are hereby corrected as shown below:

Column 7, line 10, "el" should be --electrode-- line 28, "ower" should be --power--

Column 10, line 20, "corms" should be --forms

Column 11, line 63, after "to" insert --become--

Claim 1, line 14 "prosing" should be --prising--

Claim 2, line 1, change reference to "claim 19" to --claim 1--

Claim 4, line 2, "winging" should be --winding--

Signed and sealed this 5th day of November 1974.

EAL)
test:

ROY M. GIBSON JR.
testing Officer

C. MARSHALL DANN
Commissioner of Patents